United States Patent [19]
Itoh

[11] Patent Number: 4,939,477
[45] Date of Patent: Jul. 3, 1990

[54] OUTPUT CIRCUIT HAVING A TERMINAL USED FOR A PLURALITY OF SIGNALS

[75] Inventor: Masashi Itoh, Yokohama, Japan

[73] Assignee: Kabushiki Kaisha Toshiba, Kawasaki, Japan

[21] Appl. No.: 357,751

[22] Filed: May 26, 1989

[30] Foreign Application Priority Data

Jun. 2, 1988 [JP] Japan ................................. 63-136367

[51] Int. Cl.⁵ .............................................. H03F 3/45
[52] U.S. Cl. ...................................... 330/252; 330/259
[58] Field of Search ............... 330/252, 257, 259, 260, 330/261, 290, 296, 301, 307

[56] References Cited

U.S. PATENT DOCUMENTS 4,223,276  9/1980  Nagano ............................ 330/259 X
4,435,685  3/1984  Eckert et al. .................... 330/252 X
4,517,525  5/1985  Dijkmans et al. ................... 330/260
4,577,336  3/1986  Kriedt et al. .................... 330/259 X

OTHER PUBLICATIONS

Sanyo Semiconductor Division, "Bipolar IC for Car Audio," 1988 Sanyo Semiconductor Data Book, Mar. 1, 1988, pp. 94-108.

Primary Examiner—Steven Mottola
Attorney, Agent, or Firm—Finnegan, Henderson, Farabow, Garrett, and Dunner

[57] ABSTRACT

An output circuit built in a semiconductor integrated circuit having an output terminal comprises a first transistor having a base and a collector connected to the output terminal, a second transistor having a collector connected to a power source circuit, an input signal source connected to the emitters of the first and second transistors, and a DC amplifier circuit having an input end connected to the output terminal and an output end connected to the base of the second transistor, and operated according to a preset bias potential. A signal occurring at the output terminal is fed back to the base of the second transistor via the DC amplifier circuit.

10 Claims, 6 Drawing Sheets

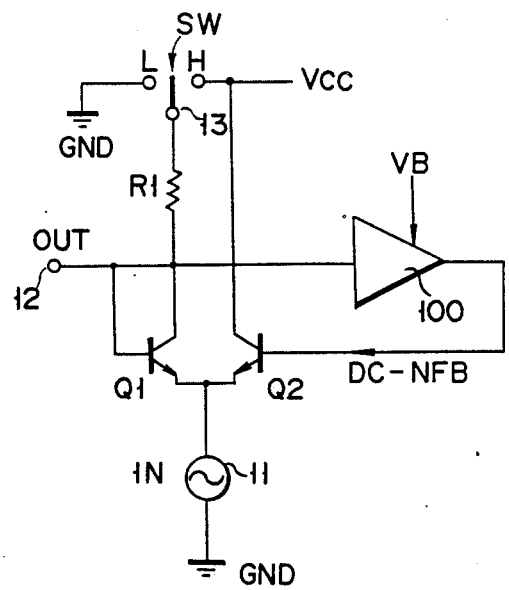
F I G. 1
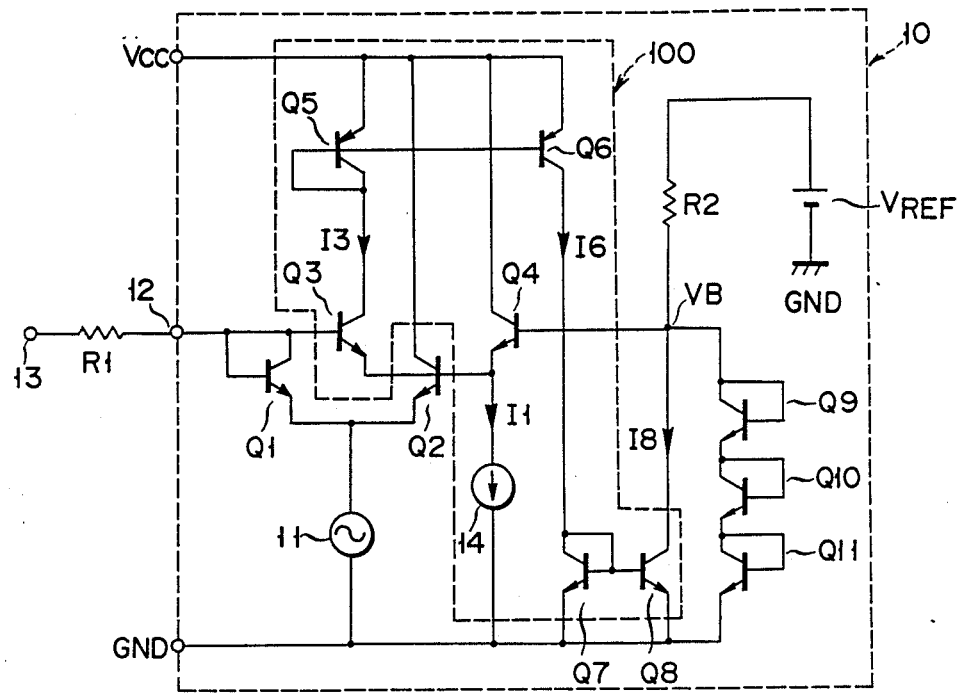
F I G. 2

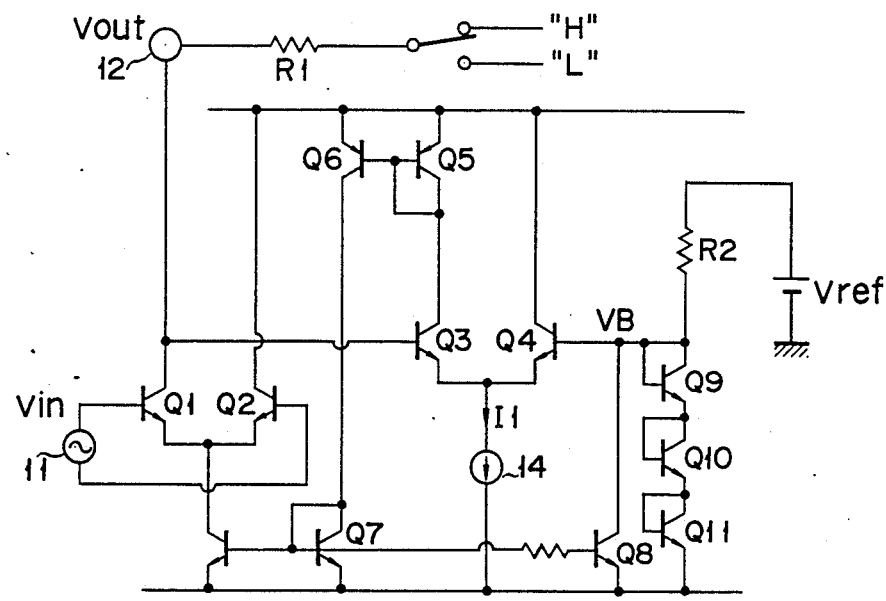
F I G. 7
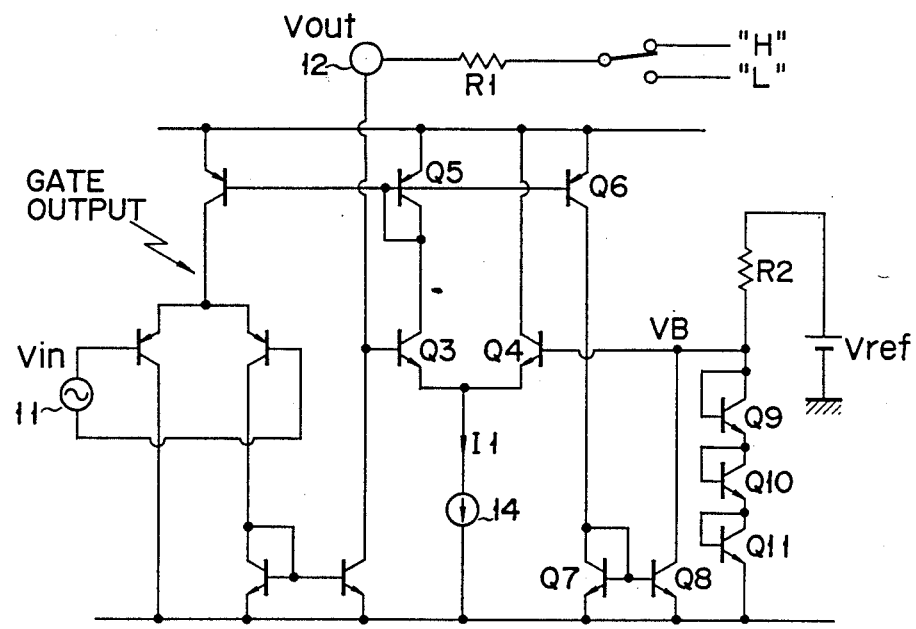
F I G. 8

OUTPUT CIRCUIT HAVING A TERMINAL USED FOR A PLURALITY OF SIGNALS

BACKGROUND OF THE INVENTION

1. Field of the Invention

This invention relates to an output circuit for outputting an IF count signal for an FM IF amplifier.

2. Description of the Related Art

First, the background art circuit will be explained, with reference to FIGS. 3 and 4. In the circuit of FIG. 3, an IF signal supplied to input terminal 1 is amplified by means of IF amplifier 2, and then supplied to output terminal 3, which is connected to power source terminal Vcc via load resistor 4. Gate circuit 5 provided separately from IF amplifier 2 is supplied with an IF count signal. The IF count signal is subsequently derived from output terminal 7 of gate circuit 5 which is controlled by a control signal supplied to control terminal 6.

However, with the circuit construction shown in FIG. 3, the amplified IF signal always appears on output terminal 3, and tends to interfere with the IF input signal and/or signals in peripheral circuits. As a result, the operation of IF amplifier 2 is liable to become unstable and affect the operation of the peripheral circuits.

To solve the above problem, IF amplifier 2 and gate circuit 5 of the circuit of FIG. 4 are formed in a single IC 8. In this Figure, portions which are the same as those in FIG. 3 are denoted by the same reference numerals. With the circuit of FIG. 4, an IF count signal is normally interrupted, and when required, a control signal is supplied to gate control terminal 6 so as to permit the IF count signal to be derived from output terminal 7. Therefore, the IF input signal and signals in the peripheral circuits will not be interfered.

However, in the circuits of FIGS. 3 and 4, two terminals, that is, gate control terminal 6 and output terminal 7 for the IF count signal, are essentially required and, therefore, it is difficult of reduce the number of terminals necessary to the IC.

As described above, in the background art output circuit, it is necessary to use the gate control terminal and IF count signal output terminal, preventing the number of terminals from being reduced.

SUMMARY OF THE INVENTION

Accordingly, an object of this invention is to provide an output circuit whose one output terminal can be used both as a gate control terminal and an IF count signal output terminal without spoiling functions of the output circuit and which can be suitably formed in the IC configuration.

The above object can be attained by an output circuit which, for example, comprises a first transistor whose base and collector are connected together; a second transistor whose emitter and collector are respectively connected to the emitter of the first transistor and a first potential supplying source to form a differential pair in cooperation with the first transistor; an input signal source connected between a second potential supplying source and a connection node between the emitters of the first and second transistors; a signal output/output control terminal connected to a connection node between the base and collector of the first transistor; a third transistor having a base connected to the signal output/output control terminal, an emitter connected to the base of the second transistor and a collector connected to the first potential supplying source; a fourth transistor whose emitter and collector are respectively connected to the base of the second transistor and to the first potential supplying source to form a differential pair in cooperation with the third transistor; a current source connected between the base of the second transistor and the second potential supplying source; bias voltage generating means for applying a preset bias voltage to the base of the fourth transistor; and control means for controlling the bias voltage applied from the bias voltage generating means to the base of the fourth transistor based on the collector current of the third transistor.

With the above construction, the first to fourth transistors are set into the non-operative condition when the signal output (for IF count signal output)/output control (gate control) terminal is set in the open condition. In contrast, when the signal output/output control terminal is set at a high potential level via a resistor, an output signal corresponding to the output level of the input signal source can be derived from the signal output/output control terminal. Thus, the signal output/output control terminal can be used both as the gate control terminal and the IF count signal output terminal and, therefore, an output circuit which is suitably formed in an IC configuration can be obtained.

BRIEF DESCRIPTION OF THE DRAWINGS

FIG. 1 is a circuit diagram showing the basic construction of an output circuit according to one embodiment of this invention;

FIG. 2 is a circuit diagram showing the basic circuit construction of FIG. 1 in more detail;

FIG. 7 is a bipolar transistor circuit showing a third modification of FIG. 2;

FIG. 8 is a bipolar transistor circuit showing a fourth modification of FIG. 2;

DETAILED DESCRIPTION OF THE PREFERRED EMBODIMENTS

Figure 3:
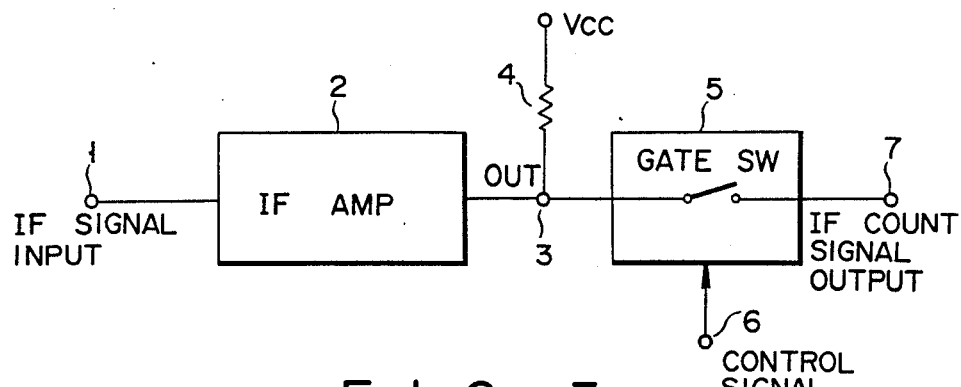
FIG. 3 is a diagram showing an example of the conventional output circuit.
Figure 4:
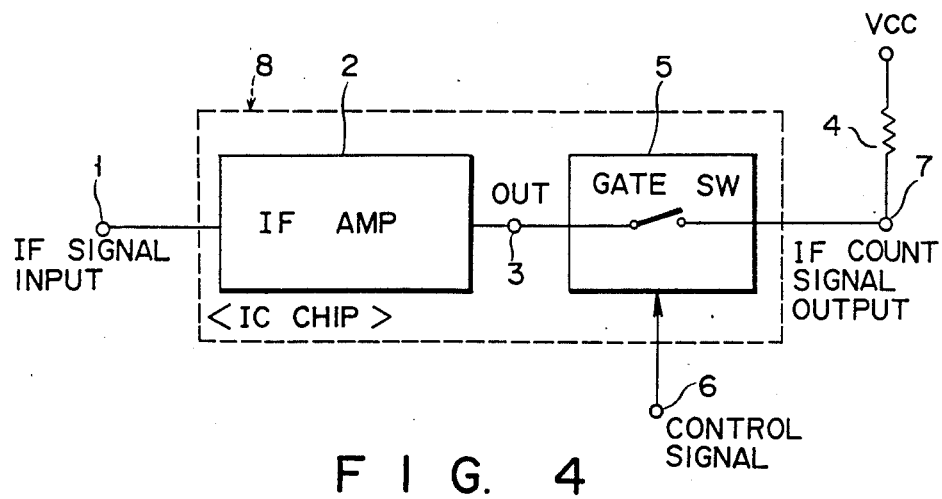
FIG. 4 is a diagram showing another example of the conventional output circuit.
Figure 5:
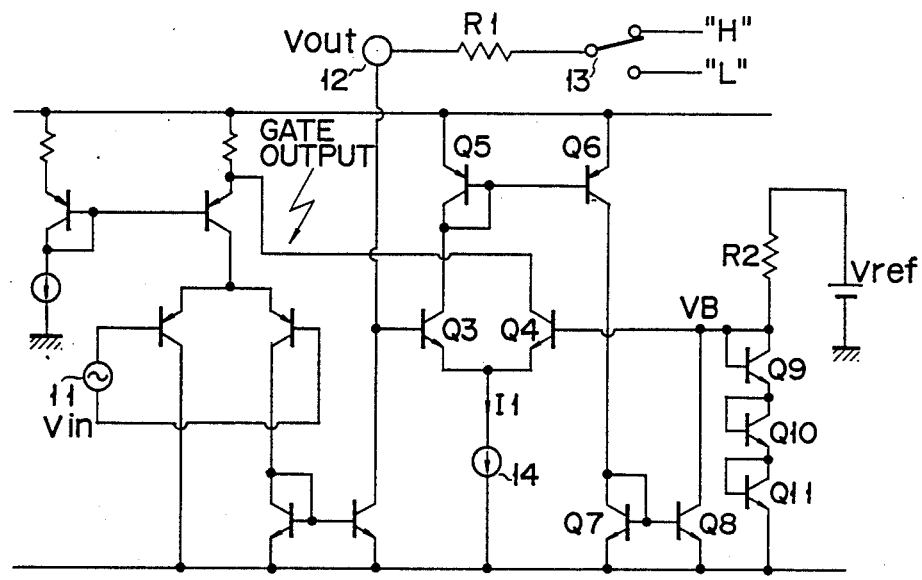
FIG. 5 is a bipolar transistor circuit showing a first modification of FIG. 2.
Figure 6:
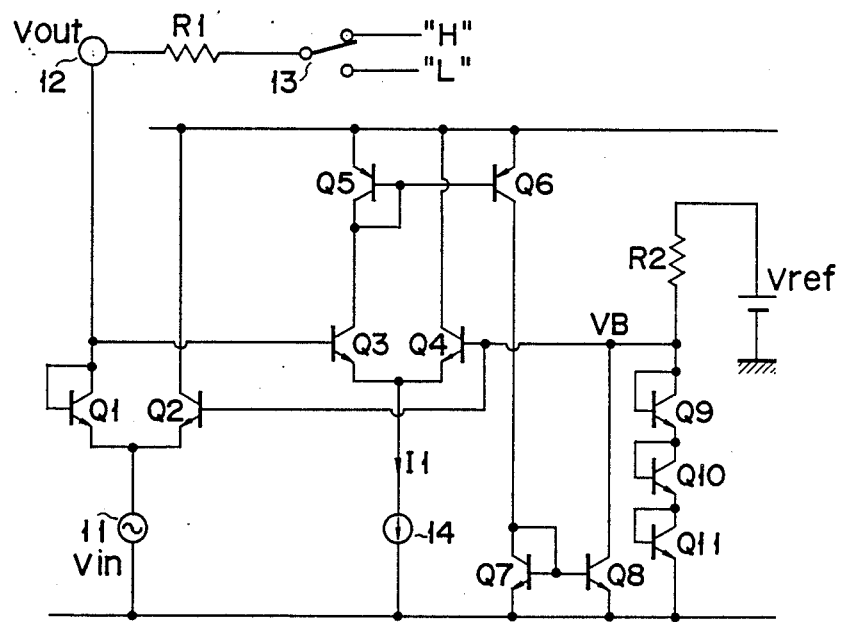
FIG. 6 is a bipolar transistor circuit showing a second modification of FIG. 2.
Figure 9:
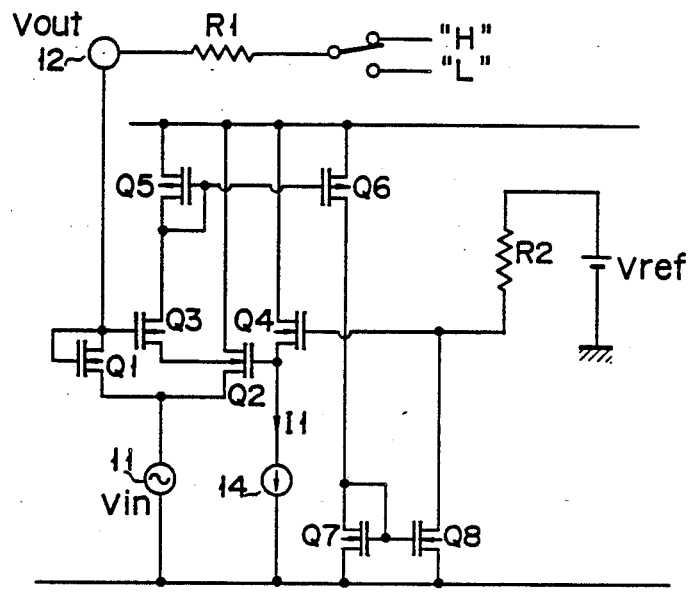
FIG. 9 is a MOS transistor circuit showing a fifth modification of FIG. 2.
Figure 10:
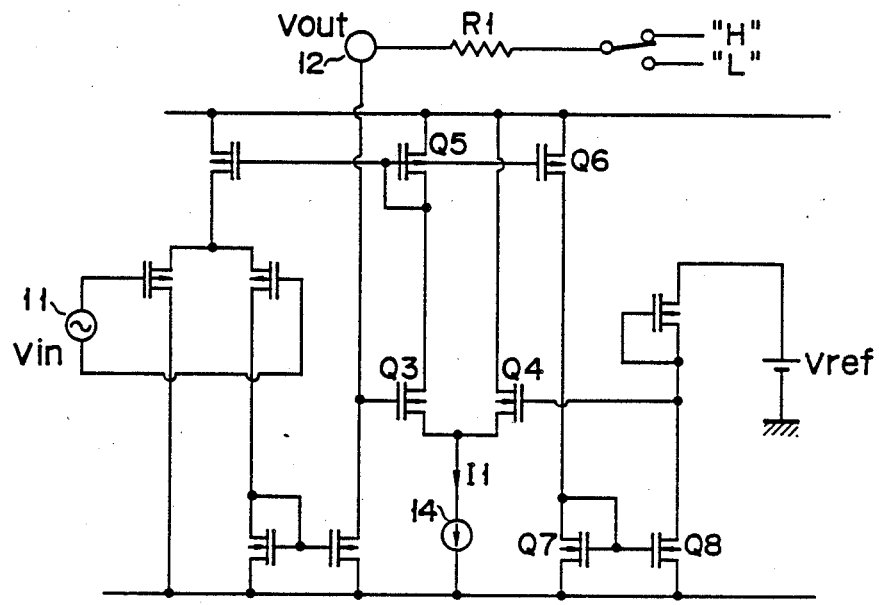
FIG. 10 is a MOS transistor circuit showing a sixth modification of FIG. 2.

There will now be described an embodiment of this invention with reference to the accompanying drawings.

FIG. 1 shows the basic construction of an output circuit according to one embodiment of this invention.

Diode-connected NPN transistor Q1 makes an operational pair (differential pair) in cooperation with NPN transistor Q2 to constitute a current share circuit. The common emitters of transistors Q1 and Q2 are supplied with input signal 11. The collector of transistor Q2 is connected to power source circuit Vcc. The collector of transistor Q1 is connected to input terminal 13 of switch SW, via load resistor R1. One end L of switch SW is connected to ground circuit GND which is set at logic level "0", and the other end H thereof is connected to power source circuit Vcc which is set at logic level "1".

Further, the collector of transistor Q1 is connected to output terminal 12 and the input terminal of DC amplifier circuit 100. Amplifier circuit 100 is supplied with potential VB for determining the operation bias point thereof. The DC output of amplifier circuit 100 is fed back to the base of transistor Q2.

If the above DC negative feedback (DC-NFB) is not provided, there is a possibility that the DC operation point of pair transistors Q1 and Q2 is clamped at the GND or Vcc level when a certain bias potential VB is applied. When such a clamp has occurred, a positive portion or negative portion of an AC signal derived from output terminal 12 will be clipped. With the above DC-NFB, occurrence of the clamp can automatically be prevented irrespective of bias potential VB.

In other words, the operational dynamic range of pair transistors Q1 and Q2 can be substantially widened by the above DC-NFB.

Further, since the diode-connection of transistor Q1 is contained in the loop of the above DC-NFB, a linearity in the voltage-current characteristic of diode-connected transistor Q1 can be improved by the feedback operation.

FIG. 2 shows an example of a circuit diagram corresponding to the circuit of FIG. 1, which can be configured into an IC. In the circuit of FIG. 2, transistors Q3 to Q8 constitute a DC amplifier circuit 100, and transistors Q9 to Q11, resistor R2 and reference voltage source VREF constitute a circuit for supplying bias voltage VB.

In FIG. 2, portion of the output circuit which is surrounded by broken line 10 is formed in an IC configuration. As shown in FIG. 2, signal current source 11 is connected between the emitters of npn transistors Q1 and Q2 and ground terminal GND, and an IF count signal is supplied from signal current source 11.

The base and collector of transistor Q1 are connected to each other, and are also connected to IF count signal output terminal 12 together with the base of npn transistor Q3. Output terminal 12 is connected to terminal 13 via load resistor R1. Since the output of the IF count signal can be controlled by changing a voltage applied to terminal 13, output terminal 12 functions as the gate control terminal.

The base of transistor Q2 is connected to the emitter of transistor Q3 and the emitter of npn transistor Q4, and the collector thereof is connected to power source Vcc. The collector of transistor Q3 is connected to a connection node between the base and collector of pnp transistor Q5, and the collector of transistor Q4 is connected to power source Vcc. The emitter of transistor Q5 is connected to power source Vcc, and the base thereof is connected to the base of pnp transistor Q6. The emitter of transistor Q6 is connected to power source Vcc, and the collector thereof is connected to a connection node between the base and collector of npn transistor Q7.

The emitter of transistor Q7 is connected to ground terminal GND, and the base thereof is connected to the base of npn transistor Q8. The emitter of transistor Q8 is connected to ground terminal GND, and the collector thereof is connected to the base of transistor Q4, a connection node between the base and collector of npn transistor Q9 and one end of resistor R2. The other end of resistor R2 is connected to the positive terminal of reference voltage terminal $V_{REF}$ whose negative terminal is connected to ground terminal GND.

Constant current source 14 is connected between a connection node of the emitters of transistors Q3 and Q4 and ground terminal GND. The emitter of transistor Q9 is connected to a connection node between the base and collector of npn transistor Q10. The emitter of transistor Q10 is connected to a connection node between the base and collector of npn transistor Q11 whose emitter is connected to ground terminal GND.

A gate circuit is constituted by a current share circuit formed of transistors Q1 and Q2, and a gate control circuit is constituted by constant current circuit 14, a current share circuit formed of transistors Q3 and Q4, and transistors Q5 to Q8. Thus, bias voltage VB, applied from a bias circuit including reference voltage source $V_{REF}$, load resistor R2, and transistors Q9 to Q11 to the base of transistor Q4, can be controlled according to the output (collector current I8) of transistor Q8.

Note that collector current I8 of transistor Q8 is proportional to collector current I6 of transistor Q6, and current I6 is proportional to collector current I3 of transistor Q3.

With the above construction, when terminal 13 is set in the open condition (or logic level "0"), terminal 12 is also set in the open condition (or set at a low potential level). As a result, transistor Q1 is turned off, preventing an IF count signal from appearing on output terminal 12. In contrast, when terminal 13 is set at a high potential level (logic level "1"), output terminal 12 is also set to a high potential level, thereby turning on transistor Q1. As a result, an IF count signal appears on output terminal 12.

There will now be described the operation of the above circuit with reference to FIG. 2.

(A) Interruption Mode of IF Count Signal

When terminal 13 is set in the open condition (or logic level "0"), output terminal 12 is set in the open condition or set at a low potential level, thereby turning off transistor Q1 of the gate circuit. Since transistor Q3 of the gate control circuit is turned off, transistors Q5 to Q8 are turned off. As a result, a bias voltage is applied to the base of transistor Q4 by means of reference voltage source $V_{REF}$, load resistor R2 and transistors Q9 to Q11 so as to turn on transistor Q4. When transistor Q4 is thus turned on, transistor Q2 is turned on. Thus, in this condition, signal current source 11 is electrically connected to power source Vcc via transistor Q2, and constant current source 14 is electrically connected to power source Vcc via transistor Q4. As a result, no IF count signal appears on output terminal 12.

(B) Output Mode of IF Count Signal

When terminal 13 is set at a high potential level (or logic level "1"), the potential of output terminal 12 becomes higher than the base potential of transistor Q4 so as to turn on transistor Q3. At this time, since the potential difference between the bases of transistors Q1 and Q2 becomes equal to base-emitter voltage $V_{BE}$ of transistor Q3, transistor Q1 is turned on and transistor Q2 is turned off. As a result, the signal current flows only in transistor Q1 so that an IF count signal can be derived out from output terminal 12 with resistor R1 used as a load.

As shown in FIG. 2, a circuit including transistors Q5 and Q6 (current detecting means) and transistors Q7 and Q8 (bias voltage control means) is provided on the output side of transistor Q3. This is because use of the additional circuit can prevent the base potential of transistor Q1 from being lowered to such a low level as the base potential of transistor Q2 according to the amplitude of the output.

If the base potential of transistor Q1 is lowered to such a low level as the base potential of transistor Q2, the signal current also flows in transistor Q2 and the signal current flowing into transistor Q1 is reduced, thereby clamping the peak value in the negative half cycle. For this reason, transistors Q5, Q6, Q7 and Q8 are sequentially turned on when transistor Q3 is turned on, so that the potential of load resistor R2 can be lowered.

When the potential of load resistor R2 is lowered, the base potential of transistor Q4 is lowered. In this case, constant current I1 flowing in load resistor R2 and constant current source 14 is so set that the base potential (VB=$V_{REF}$−R2×I8) of transistor Q4 can be always set smaller than the peak value (with respect to the ground potential) in the negative half cycle of the output amplitude of output terminal 12. Then, the base potential of transistor Q3 is always kept higher than the base potential of transistor Q4 and transistor Q3 is always kept on, causing all the constant current I1 to flow in transistor Q3. As a result, the potential difference between the bases of transistors Q1 and Q2 becomes equal to the base-emitter voltage $V_{BE}$ of transistor Q3. Therefore, transistor Q1 is always kept on and transistor Q2 is always kept off, thereby preventing the peak value in the negative half cycle from being clamped.

The base potential of transistor Q3 also fluctuates according to the amplitude of the output. However, in this case, constant current I1 flowing in constant current source 14 is used as a control current for determining the internal circuit condition and transistor Q3 functions only to pass constant current I1 from the collector thereof to the emitter. Therefore, constant current I1 will not be affected by fluctuation in the base potential of transistor Q3. This effect can be attained by keeping transistor Q3 on and transistor Q2 off in the IF count signal output mode and electrically separating the gate circuit and the gate control circuit from each other.

When transistor 13 is set into the open condition, transistor Q1 is turned off to interrupt the IF count signal, thus setting the condition (A).

As described above, according to this invention, the following effects can be attained.

Since a single terminal can be used both as the gate control terminal and the output terminal, two terminals which are required for the gate control and IF signal output in the background art circuit can be replaced by only one terminal. Further, the number of elements used in the circuit can be reduced, making the output circuit suitable for the IC.

Since the IF count signal can be obtained simply by applying an adequate potential to the output terminal via the load resistor, the operability and setting design can be simplified. Particularly, the circuit is suitable for the system such as a digital tuning system (DTS) in which the IF count signal is controlled by a microcomputer.

Since the IF count signal can be output only when required, there occurs no interference between the IF count signal and the input IF signal or signals in the peripheral circuits.

In the above embodiment, although the circuit is formed of bipolar transistors, it can be formed of MOS transistors or bipolar/MOS transistors.

Figure 11:
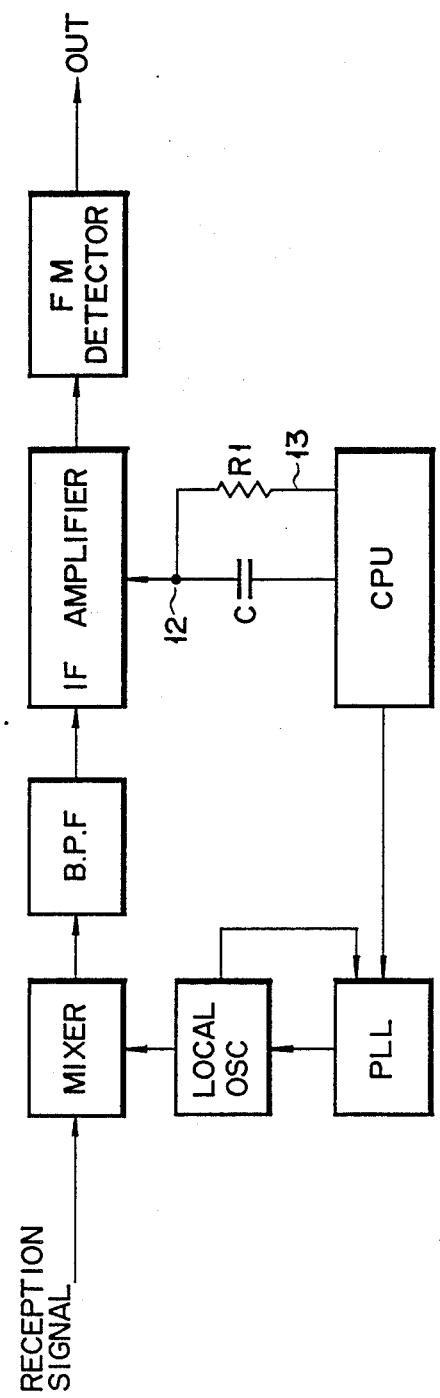
FIG. 11 is a block diagram of a main part of a CPU-controlled FM (or TV) tuner to which the present invention can be applied.

For instance, the embodiment of FIG. 2 can be modified as shown in FIGS. 5–10. Further, the present invention can be applied to a more complicated circuitry such as FM/TV tuner as is shown in FIG. 11.

What is claimed is:

1. An output circuit built in a semiconductor integrated circuit having an output terminal comprising:
   a first transistor having a base and a collector connected to the output terminal;
   a second transistor having a collector connected to a power source circuit;
   an input signal source connected to emitters of said first and second transistors; and
   a DC amplifier circuit having an input end connected to the output terminal and an output end connected to the base of said second transistor, and operated under a preset bias potential,
   wherein a signal occurring at the output terminal is fed back to the base of said second transistor, via said DC amplifier circuit.

2. An output circuit according to claim 1, wherein said DC amplifier circuit includes:
   a third transistor having a same conductivity type as that of said first and second transistors, and having a base connected to the output terminal and an emitter connected to the base of said second transistor;
   a fourth transistor having a collector connected to the power source circuit, a base supplied with the bias potential, and an emitter connected to an emitter of said third transistor; and
   a constant current source connected to the emitters of said third and fourth transistors.

3. An output circuit according to claim 2, wherein said DC amplifier circuit includes:
   a reference voltage source for providing a preset reference voltage; and
   voltage dividing means for deriving the bias potential by dividing the preset reference voltage of said reference voltage source, and supplying the bias potential to the base of said fourth transistor.

4. An output circuit according to claim 3, wherein said voltage dividing means includes:
   a voltage dividing resistor connected between said reference voltage source and the base of said fourth transistor; and
   at least one diode structure connected between the base of said fourth transistor and a second power source circuit and forward-biased by said reference voltage source.

5. An output circuit according to claim 2, wherein said DC amplifier circuit includes:
   bias potential changing means for supplying a current corresponding to a collector current of said third transistor to said voltage dividing means, so that the bias potential is changed according to the collector current of said third transistor.

6. An output circuit according to claim 5, wherein said bias potential changing means includes:
   a fifth transistor having a conductivity type opposite to that of said third transistor, the base and collector of said fifth transistor being connected to the collector of said third transistor and the emitter thereof being connected to said power source circuit;

a sixth transistor having the same conductivity type as said fifth transistor, the base of said sixth transistor being connected to the base of said fifth transistor and the emitter thereof being connected to said power source circuit;

a seventh transistor having the same conductivity type as said third transistor, the base and collector of said seventh transistor being connected to the collector of said sixth transistor and the emitter thereof being connected to a second power source circuit; and an eighth transistor having the same conductivity type as said seventh transistor, the base of said eighth transistor being connected to the base of said seventh transistor, the emitter thereof being connected to said second power source circuit and the collector thereof being connected to the base of said fourth transistor.

7. An output circuit according to claim 3, wherein said DC amplifier circuit includes:

bias potential changing means for supplying a current corresponding to a collector current of said third transistor to said voltage dividing means, so that the bias potential is changed according to the collector current of said third transistor.

8. An output circuit according to claim 7, wherein said bias potential changing means includes:

a fifth transistor having a conductivity type opposite to that of said third transistor, the base and collector of said fifth transistor being connected to the collector of said third transistor and the emitter thereof being connected to said power source circuit;

a sixth transistor having the same conductivity type as said fifth transistor, the base of said sixth transistor being connected to the base of said fifth transistor and the emitter thereof being connected to said power source circuit;

a seventh transistor having the same conductivity type as said third transistor, the base and collector of said seventh transistor being connected to the collector of said sixth transistor and the emitter thereof being connected to a second power source circuit; and an eighth transistor having the same conductivity type as said seventh transistor, the base of said eighth transistor being connected to the base of said seventh transistor, the emitter thereof being connected to said second power source circuit and the collector thereof being connected to the base of said fourth transistor.

9. An output circuit according to claim 1, further comprising:

a load resistor connected to said output terminal and arranged outside said semiconductor integrated circuit.

10. An output circuit comprising:

a first transistor whose base and collector are connected together;

a second transistor, having an emitter and collector respectively connected to an emitter of said first transistor and a first potential supplying source, which forms a differential pair in cooperation with said first transistor;

an input signal source connected between a second potential supplying source and a connection node between the emitters of said first and second transistors;

a signal-output/output-control terminal connected to a connection node between the base and collector of said first transistor;

a third transistor having a base connected to said signal-output/output-control terminal, an emitter connected to the base of said second transistor, and a collector connected to said first potential supplying source;

a fourth transistor, having an emitter and collector respectively connected to the base of said second transistor and said first potential supplying source, which forms a differential pair in cooperation with said third transistor;

a current source connected between the base of said second transistor and said second potential supplying source;

bias voltage generating means for applying a preset bias voltage to the base of said fourth transistor; and means for controlling the bias voltage, applied from said bias voltage generating means to the base of said fourth transistor, based on a collector current of said third transistor.

* * * * *